US006232239B1

(12) United States Patent
Lim et al.

(10) Patent No.: US 6,232,239 B1
(45) Date of Patent: *May 15, 2001

(54) METHOD FOR CLEANING CONTACT HOLES IN A SEMICONDUCTOR DEVICE

(75) Inventors: Kwang-shin Lim, Seoul; Eun-a Kim, Yongin; Sang-o Park, Osan; Kyung-seuk Hwang, Yongin, all of (KR)

(73) Assignee: Samsung Electronics., Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/141,207

(22) Filed: Aug. 26, 1998

(30) Foreign Application Priority Data

Aug. 30, 1997 (KR) .................................................. 97-44819

(51) Int. Cl.[7] .................................................. H01L 21/338
(52) U.S. Cl. .......................... 438/745; 438/963; 438/906; 510/175
(58) Field of Search .................................. 438/245, 963, 438/906; 510/175

(56) References Cited

U.S. PATENT DOCUMENTS

| | | | |
|---|---|---|---|
| 5,650,041 | * | 7/1997 | Gotoh et al. ...................... 156/653.1 |
| 5,650,664 | * | 7/1997 | Sakamoto ............................ 257/764 |
| 5,782,984 | * | 7/1998 | Lim et al. ................................ 134/2 |
| 5,876,509 | * | 3/1999 | Nam ........................................ 134/3 |
| 5,972,862 | * | 10/1999 | Torii et al. ........................... 510/175 |
| 5,981,375 | * | 11/1999 | Terada ................................. 438/624 |
| 5,989,970 | * | 11/1999 | Ohkawa et al. ..................... 438/384 |
| 5,990,507 | * | 11/1999 | Mochizuki et al. ................. 257/295 |
| 6,017,784 | * | 1/2000 | Ohta et al. ........................... 438/197 |

OTHER PUBLICATIONS

Wet Chemical Cleaning for Damaged Layer Removal Inside Deep Sub–Micron Contact Hole, Miyamoto et al., 1998, IEEE/SEMI Advanced Semiconductor Manufacturing Conference.*

* cited by examiner

*Primary Examiner*—Richard Elms
*Assistant Examiner*—Adam Pyonin
(74) *Attorney, Agent, or Firm*—Marger Johnson & McCollom, P.C.

(57) ABSTRACT

A method for removing impurities and deposits formed in a contact hole of a semiconductor device. The method comprises the step of bathing the semiconductor device in a solution having concentrations of between about 25 to 35 weight percent of Isopropyl Alcohol (IPA), 2 to 4 weight percent of $H_2O_2$, 0.05 to 0.25 weight percent of HF, and the remaining percent of deionized water. Such bathing is preferably carried out with the solution maintained at a constant temperature of between about 20 to 25° C. for about 1 to 5 minutes.

28 Claims, 4 Drawing Sheets

METHOD FOR CLEANING CONTACT HOLES IN A SEMICONDUCTOR DEVICE

BACKGROUND OF THE INVENTION

1. Field of the Invention

The present invention relates to semiconductor fabrication, and more particularly, to a method for cleaning the contact holes of semiconductor devices to eliminate unwanted impurities and deposits introduced during the contact hole formation process.

2. Description of the Related Art

Contact holes are apertures formed through layers of a semiconductor device for the purpose of filling them with conducting material such as aluminum and thereby electrically coupling one layer to another layer. By way of example, such a contact hole can be formed to connect an upper electrode with a lower electrode in a multilayered unit cell structure of a semiconductor device.

Contact holes are conventionally formed using photo-etching techniques that are well known in the art. Such a process has several drawbacks, however. First, the chemical reaction of the etched region and the ambient oxygen in the atmosphere causes a native oxide film to grow on the lower side of the contact hole. Second, a chemical reaction between the carbon of the photoresist mask used during lithography with the reaction gas used in the dry-etching process causes a polymer to form on the sidewalls of the contact hole. These unwanted deposits deteriorate the electrical characteristics of the semiconductor device. Third, impurities such as copper (Cu), Gold (Au) and other materials are known to exist in the contact hole after formation for a variety of reasons. Such deposits are known to cause failure of the semiconductor device.

To address these problems, a cleaning process is carried out on the contact holes in order to remove the native oxide film, the polymer, or impurities such as Cu and Au. In the conventional cleaning process, the semiconductor wafer is bathed in a first cleaning process at 120° C. in a cleaning composition composed of $H_2SO_4$ and $H_2O_2$ in respective weight percents of 80/20 or 85/15. The profile of the inside wall of the contact hole is maintained in this first cleaning process. Then, the wafer is bathed in a second cleaning process at 25° C. for 45–90 seconds in a cleaning composition composed of $H_2SO_4$ and $H_2O_2$ in respective weight percents of 99.5/0.5.

Because of the small size of the contact holes and the surface tension of the cleaning solutions used, it is difficult to introduce the cleaning solution into the lower end of the contact hole. This becomes even more of a problem as device sizes are reduced due to improvements in lithographic techniques. Consequently, despite these cleaning processes, the native oxide film and other impurities still remain on the lower side and sidewalls of the contact hole. This results in a degradation of the electrical characteristics of the semiconductor devices.

Accordingly, the need exists for a better method for removing unwanted deposits and impurities from contact hole formation during the manufacture of semiconductor devices.

SUMMARY OF THE INVENTION

The present invention is directed to provide a method for cleaning the contact holes of a semiconductor device, which obviates one or more problems due to the limitations and disadvantages of the related art.

Another object of the present invention is to provide a method for cleaning the contact holes of a semiconductor device, wherein the cleaning composition is sufficiently introduced down to the lower side of the contact hole so that the cleaning efficiency is greatly improved.

To achieve these and other advantages and in accordance with the purpose of the present invention as embodied and broadly described, the method of cleaning contact hole comprises the step of bathing the semiconductor device in a solution having concentrations of between about 25 to 35 weight percent of Isopropyl Alcohol (IPA), 2 to 4 weight percent of $H_2O_2$, 0.05 to 0.25 weight percent of HF, and the remaining percent of deionized water. Such bathing is preferably carried out with the solution maintained at a constant temperature of between about 20 to 25° C. for about 1 to 5 minutes.

Contact holes are used in a variety of semiconductor devices, the following of which are only by way of example:

The contact hole can be coupled to an impurity region on a semiconductor substrate functioning as the source region or drain region of a MOS transistor. Films, on the semiconductor substrate, that have the contact hole pass through them comprise a sequentially-deposited oxide film and a borophosphorsilicate glass (BPSG) film, or a sequentially-deposited first oxide film, a silicon nitride film, a second oxide film, a first Tetra-ethyl-orthosilicate (TEOS) film, and a second TEOS film.

In another embodiment, the contact hole can be coupled to the gate electrode formed on a semiconductor substrate, whereby the contact hole passes through a second oxide film, a first TEOS film, and a second TEOS film.

In yet another embodiment, the contact hole is coupled to a titanium silicide film formed on a semiconductor substrate, whereby the contact hole passes through an oxide film, a first TEOS film, and a second TEOS film.

Also, the contact hole can be coupled to a sublayered-structure of the semiconductor device, whereby the contact hole passes through a sequentially-deposited first oxide film, a first BPSG film, a polysilicon film, a tungsten silicide film, a first silicon nitride film, a second BPSG film, a second silicon nitride film, and a second oxide film. In addition, the contact hole can be coupled to the sublayer structure through a BPSG film, or a double-layer of a first BPSG film and a second BPSG film. Alternately, the structure can be a sequentially-deposited first oxide film, a first BPSG film, a second oxide film, a second BPSG film, and a third BPSG film.

The cleaning solution is sufficiently introduced deep inside the contact hole by controlling the concentration of IPA in the cleaning solution. In addition, metallic impurities existing inside the contact hole are removed by controlling the concentration of $H_2O_2$ of the cleaning solution. Finally, the native oxide film located on the lower side of the contact hole is removed and the profile of the contact hole is controlled by controlling the concentration of HF of the cleaning solution.

It is to be understood that both the foregoing general description and the following detailed description are exemplary and explanatory and are intended to provide further explanation of the invention as claimed.

DETAILED DESCRIPTION OF THE PREFERRED EMBODIMENTS

Reference will now be made in detail to the preferred embodiments of semiconductor devices whose contact holes are cleaned according to the present invention, examples of which are illustrated in the accompanying drawings.

In order to clean the contact hole of a semiconductor device according to the present invention, first, a wafer having contact holes, formed by known methods such as photo-etching process, is put into a container having a cleaning solution. The cleaning solution preferably comprises from between about 25 to 35 weight percent of Isopropyl Alcohol (IPA), between about 2 to 4 weight percent of $H_2O_2$, and between about 0.05 to 0.25 weight percent of HF with the remaining portion of the solution being deionized water. Most preferably, the cleaning composition comprises about 30 weight percent of Isopropyl Alcohol, about 3.0 weight percent of $H_2O_2$, about 0.15 weight percent of HF, and remaining portion being deionized water.

The semiconductor device is maintained within the solution for between about 1 to 5 minutes before being removed from the container. The process is preferably carried out with the solution being between about 20 and 25° C. and most preferably being held at a constant temperature.

Each of the chemicals used in the cleaning solution serves a particular purpose. The HF of the cleaning solution removes a native oxide film, polymer, and metallic impurities placed on the lower side of the contact hole. The $H_2O_2$ removes metallic impurities such as Cu, Au, etc., which are not removed by the HF, and controls the profile of the inner wall of the contact hole. The IPA prevents the impurities removed by the HF and the $H_2O_2$ from adhering to the contact hole surfaces, and reduces the surface tension of the cleaning solution so that it can be sufficiently introduced throughout the contact hole.

The efficiency with which the impurities existing on the inner wall of the contact hole are removed depends on the concentrations of HF, $H_2O_2$, and IPA used within the cleaning solution. The profile of the contact hole pattern can also be adjusted in the same manner.

FIGS. 1 through 8 illustrate cross-sectional views of contact holes formed within semiconductor devices that can be cleaned according to the present invention. The figures are only intended to illustrate examples of semiconductor devices that can be cleaned according to the present invention. It is understood, of course, that other devices could be cleaned in the manner described below.

Figure 1:
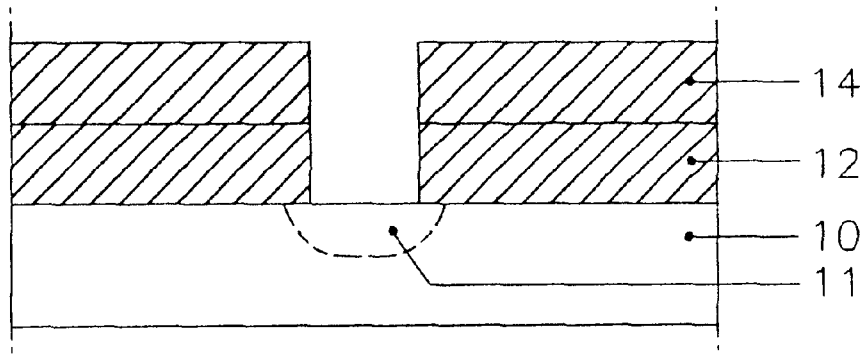
FIGS. 1 through 8 illustrate cross-sectional views of contact holes formed within semiconductor devices that can be cleaned according to the present invention.

Referring to FIG. 1, an oxide film 12 is formed on a semiconductor substrate 10 having an impurity region 11 that functions as a source or drain region of a MOS transistor. The oxide film 12 is formed by a High Temperature Oxidation method, wherein semiconductor wafer is introduced into a crucible of oxygen at high temperature.

After forming a borophosphorsilicate glass (BPSG) film 14 on the oxide film 12, the contact hole is formed by well-known photo-etching processes such as by dry etching.

Figure 2:
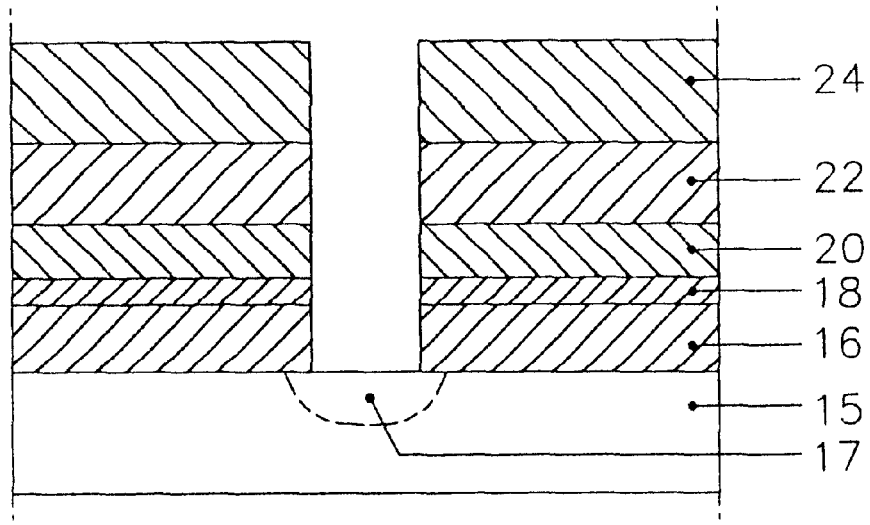

Referring to FIG. 2, with the injection of N-type or P-type impurities, a first oxide film 16, a silicon nitride film 18, a second oxide film 20, a first TEOS film 22, and a second TEOS film 24 are sequentially deposited on a semiconductor substrate 15 having an impurity region 17 functioning as a source or drain region of a MOS transistor. As with the semiconductor device of FIG. 1, the contact hole is preferably formed by a dry-etching process. The first oxide film 16 is formed by High Temperature Oxidation (HTO). The silicon nitride film 18 comprises silicon oxinitride (SiON). The second oxide film 20 is formed by using plasma. Finally, the first TEOS film 22 is formed by using ozone, and the second TEOS film 24 is formed by using plasma.

Figure 3:
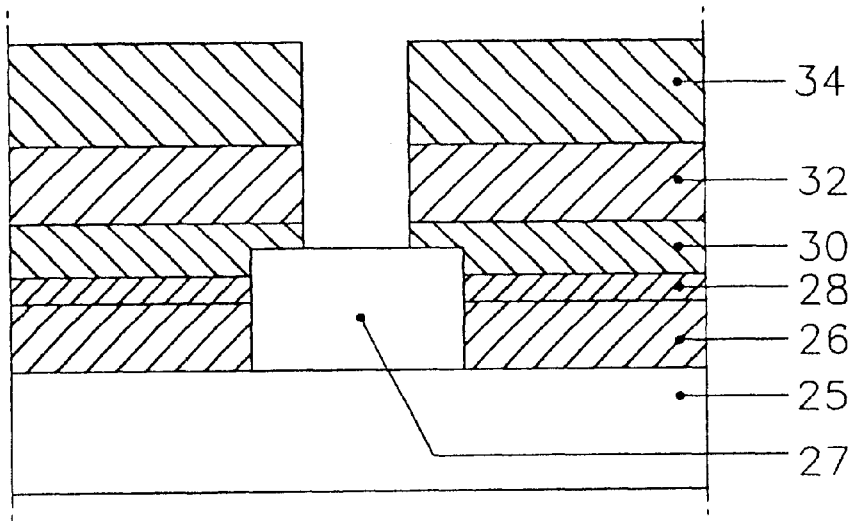

Referring to FIG. 3, a conductive poly-silicon of silicon film, or a gate electrode 27 made of silicon film and tungsten silicide (WSi) film are formed on a semiconductor substrate 25. A gate oxide film (not shown) is formed between the gate electrode 27 and the semiconductor substrate 25. A first oxide film 26 and a silicon nitride film 28 are formed on the sidewalls of the gate electrode 27. A second oxide film 30, a first TEOS film 32, and a second TEOS film 34 are sequentially formed on the gate electrode 27. The second oxide film 30 is formed by using plasma, the first TEOS film 32 is formed by ozone, and the second TEOS film 34 is formed by using plasma. Then, the contact hole is formed by a dry etching process.

Figure 4:
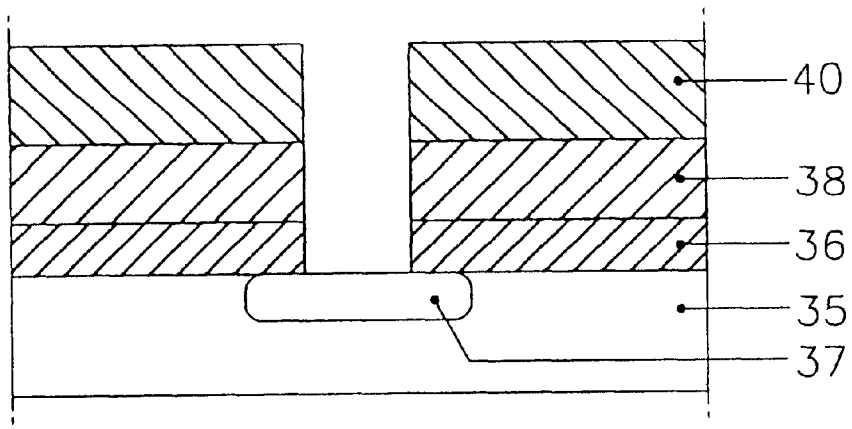

Referring to FIG. 4, an oxide film 36, a first TEOS film 38, and a second TEOS film 40 are formed on the semiconductor substrate 35 having a titanium silicide (TiSi) film 37 formed thereon. The oxide film 36 is formed by using plasma, the first TEOS 38 film by ozone, and the second TEOS film 40 by plasma, respectively. Then, the contact hole is formed by dry-etching so that the titanium silicide film 37 is exposed.

Figure 5:
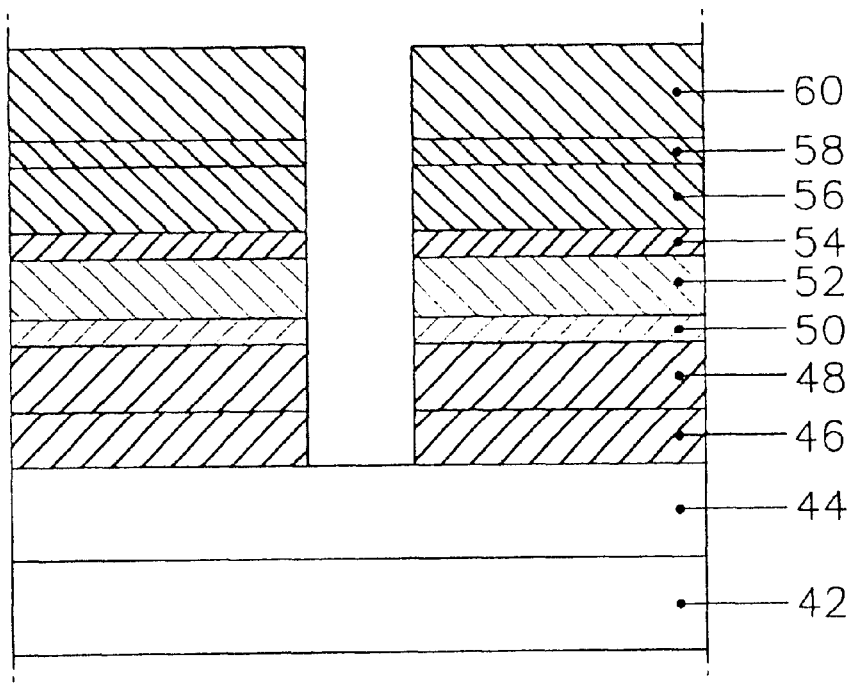

Referring to FIG. 5, the semiconductor substrate 42 includes a certain sublayered-structure 44 such as a transistor, etc. Formed thereon are a sequentially-formed first oxide film 46, a first BPSG film 48, a polymer 50, a tungsten silicide film 52, a first silicon nitride film 54, a second BPSG film 56, a second silicon nitride film 58, and a second oxide film 60. The first oxide film 46 and the second oxide film 60 are formed by HTO, and the first silicon nitride film 54 is formed by using plasma. The contact hole is formed by dry-etching. Finally, a capacitor is formed on the upper side of tie contact hole in a subsequent process.

Figure 6:
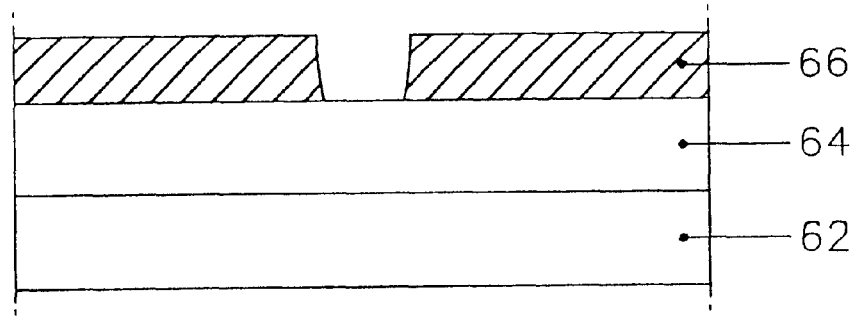

Referring to FIG. 6, a BPSG film 66 is formed on a semiconductor substrate 62 having a certain sublayered-structure 64 such as transistor, capacitor, etc. already formed thereon. Then, the contact hole is formed by a wet-etching process.

Figure 7:
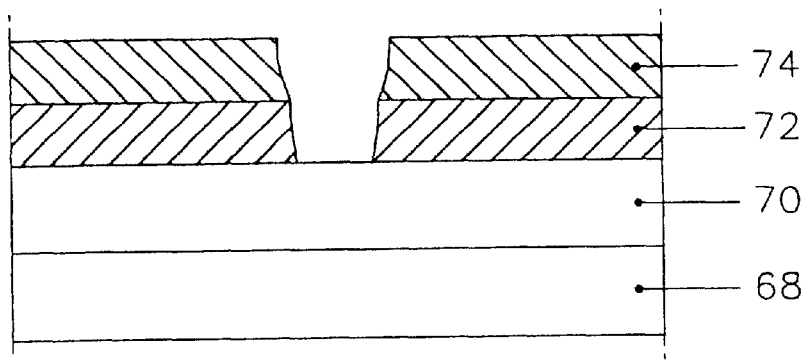

Referring to FIG. 7, a first BPSG film 72 and a second BPSG film 74 of differing thicknesses are sequentially formed on a semiconductor substrate 68 having a certain sublayered-structure 70 such as transistor and capacitor, etc. The contact hole is then formed by a wet-etching process.

Figure 8:
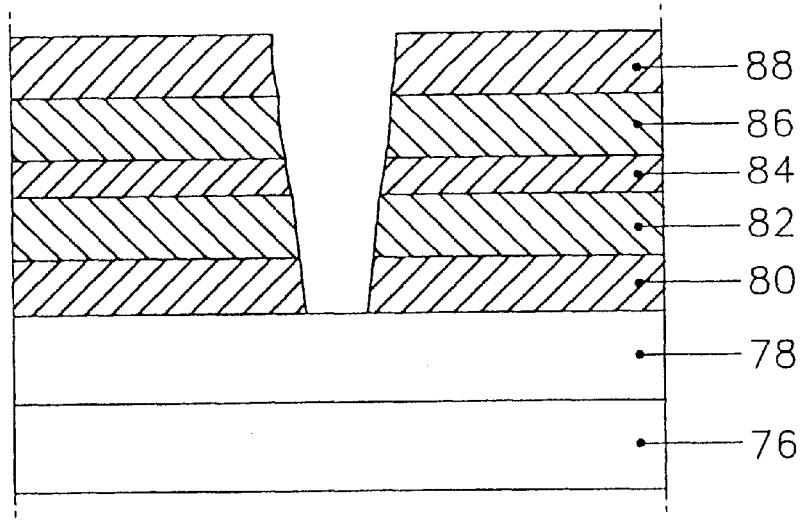

Referring to FIG. 8, the contact hole is formed by a wet etching process on a semiconductor substrate 76 having a certain sublayered-structure 78 such as transistor and capacitor, a first oxide film 80, a first BPSG film 82, a second oxide film 84, a second BPSG film 86 and a third BPSG film 88. The first oxide film 80 is formed by HTO, and the second oxide film 84 is formed by using plasma.

Wafers Prepared Using Cleaning Method of Present Invention

Wafers having contact holes formed on a gate electrode as shown in FIG. 3, and on a source region or drain region as shown in FIGS. 1 and 2 were treated using the process taught by the present invention. More specifically, the wafers were put into a container having a cleaning solution which comprised 30 weight percent of Isopropyl Alcohol (IPA), 3 weight percent of $H_2O_2$, 0.15 weight percent of HF, and the remaining percent of deionized water. The solution was maintained at temperatures of between 20 to 25° C.

After 1 to 5 minutes of treatment, the wafers were removed from the solution bath. Here, the concentration of the IPA of the cleaning composition was controlled so that the cleaning solution was sufficiently induced deep into the inside of the contact hole. The concentration of the $H_2O_2$ determines the efficiency with which metallic impurities existing inside the contact hole (e.g., Cu, Au, etc.) are removed. In addition, the removal of the native oxide film and the profile of the contact hole is controlled by the concentration of HF used in the cleaning solution. HF is typically the dominant element used in the contact hole etching step so that the profile of the contact hole may be determined according to the sub-layer etch rate selected by the operator.

Then, after depositing metallic material inside the contact hole, the contact resistance of the deposed material is measured. The contact resistance measures the electrical resistance of the contact side of the metal and the surface of the semiconductor substrate by applying about 10 V of voltage inside the contact hole. A lower contact resistance means that fewer impurities exist inside the contact hole.

As measured, the contact resistance was 7.99 Ω on the contact hole formed on gate electrode, 169 Ω on the contact hole formed on the upper side of the source region having a $P^+$ type-injected impurity, and 67.8 Ω on the contact hole formed on the upper side of the drain region having an $N^+$ type-injected impurity.

Wafers Prepared Using Prior Art Cleaning Method

Wafers having contact holes formed on a gate electrode as shown in FIG. 3, and on a source region or drain region as shown in FIGS. 1 and 2 were treated using a popular cleaning process known in the art. In a first step of this cleaning process, the wafers were put into a container having a cleaning solution which comprised 80 weight percent of $H_2SO_4$, 20 weight percent of $H_2O_2$, or 85 weight percent of $H_2SO_4$, 15 weight percent of $H_2O_2$. The solution was maintained at a temperature of 120° C. during this first step.

After the first step of the prior art cleaning process, the wafers were put into a container having a cleaning solution comprising 99.5 weight percent of $H_2SO_4$ and 0.5 weight percent of $H_2O_2$ for 45 to 90 seconds.

Then, metallic materials were deposited inside the contact hole cleaned as above. The contact resistance was measured by applying about 10 V of specific voltage inside the contact hole.

The contact resistance measured in the control group was 8.0 Ω on the contact hole formed on gate electrode, 364 Ω on the contact hole formed on the upper side of the source region having a $P^+$ type-injected impurity, and 638 Ω on the contact hole on the upper side of the drain region having an $N^+$ type-injected impurity.

Table 1 lists the contact resistance advantage of the samples prepared using the present invention versus the sample prepared using known techniques.

TABLE 1

Comparison of Contact Resistance (Ω)

| Cleaning Composition | Gate Electrode | Source Region | Drain Region |
|---|---|---|---|
| Present Invention | 7.99 Ω | 169 Ω | 67.8 Ω |
| Prior Art | 8.0 Ω | 364 Ω | 638 Ω |

As shown in the Table 1, the contact resistance on a gate electrode, a source region, and a drain region show lower values. This means that the samples prepared using the method taught by the present invention includes fewer impurities such as native oxide film, polymer, Cu, or Au, etc. within the contact hole. Accordingly, the native oxide film formed on the lower side of the contact hole and the impurities such as polymer, Cu, Au, etc. formed on the sidewalls of the contact hole are effectively removed by the present invention. Therefore, the failure rate of semiconductor devices caused by unwanted impurities introduced during the contact hole formation process is reduced.

While the present invention has been described in detail, it should be understood that various changes, substitutions and alterations can be made hereto without departing from the spirit and scope of the invention as defined by the appended claims.

What is claimed is:

1. A method for treating a contact hole formed in a semiconductor device comprising the step of:

providing a semiconductor device having a contact hole; and bathing the semiconductor device in a solution comprising isopropyl alcohol (IPA), $H_2O_2$, and HF to form a contact hole, wherein the solution has a concentration of approximately 25 to 35 weight percent isopropyl alcohol, approximately 2 to 4 weight percent $H_2O_2$, and approximately 0.05 to 0.25 weight percent HF.

2. The method according to claim 1 wherein the remaining solution is deionized water.

3. The method according to claim 1, further including the step of maintaining the solution at a constant temperature during said bathing step.

4. The method according to claim 1, further including the step of maintaining the solution at a temperature of between about 20 and 25° C. during said bathing step.

5. The method according to claim 1, further including the step of removing the semiconductor device from the solution after between about 1 to 5 minutes.

6. The method according to claim 1, wherein said contact hole is formed by dry etching.

7. The method according to claim 1 wherein the solution has a concentration of about 30 weight percent isopropyl alcohol, about 3.0 weight percent $H_2O_2$, and about 0.15 weight percent HF.

8. The method according to claim 1, wherein said contact hole is coupled to an impurity region of the semiconductor device functioning as a source region or a drain region of a MOS transistor on a semiconductor substrate.

9. The method according to claim 8, wherein said contact hole is formed through a sequentially-deposited oxide film and a borophosphorsilicate glass (BPSG) film.

10. The method according to claim 9, wherein said oxide film is formed by High Temperature Oxidation.

11. The method according to claim 8, wherein said contact hole is formed through a sequentially-deposited a first oxide film, a silicon nitride film, a second oxide film, a first Tetra-ethyl-orthosilicate (TEOS) film, and a second TEOS film.

12. The method according to claim 11, wherein said first oxide film is formed by High Temperature Oxidation, and said second oxide film is formed by using plasma.

13. The method according to claim 12, wherein said first TEOS film is formed by using ozone ($O_3$), and said second TEOS film is formed by using plasma.

14. The method according to claim 1, wherein said contact hole is coupled to a gate electrode formed on a semiconductor substrate.

15. The method for cleaning contact holes as claimed in claim 14, wherein said contact hole is formed through a second oxide film, a first Tetra-ethyl-orthosilicate (TEOS) film, and a second TEOS film.

16. The method according to claim 1, wherein said contact hole is coupled to a titanium silicide film formed on a semiconductor substrate.

17. The method according to claim 16, wherein said contact hole is formed through an oxide film, a first Tetra-ethyl-orthosilicate (TEOS) film, and a second TEOS film.

18. The method according to claim 17, wherein said oxide film is formed by using plasma, said first TEOS film by ozone ($O_3$), and said second TEOS film by plasma.

19. The method according to claim 1, wherein said contact hole is coupled to a sublayered structure formed above a semiconductor substrate.

20. The method according to claim 19, wherein said contact hole is formed through a sequentially-deposited first oxide film, a first borophosphorsilicate glass (BPSG) film, a polysilicon film, a tungsten silicide film, a first silicon nitride film, a second BPSG film, a second silicon nitride film, and a second oxide film.

21. The method according to claim 20, wherein said first oxide film and said second oxide film are formed by High Temperature Oxidation.

22. The according to claim 21, wherein said first silicon nitride film is formed by using plasma.

23. The method according to claim 22, further including the step of forming a capacitor on the semiconductor device after the bathing step.

24. The method according to claim 19, wherein said contact hole is formed through a borophosphorsilicate glass (BPSG) film.

25. The method according to claim 24, wherein said BPSG film comprises a first BPSG film and a second BPSG film as a double-layer structure.

26. The method according to claim 24, wherein said contact hole is formed by wet etching.

27. The cleaning method of contact hole as claimed in claim 19, wherein films having said contact hole comprise sequentially-deposited a first oxide film, a first BPSG film, a second oxide film, a second BPSG film, and a third BPSG film.

28. The cleaning method of contact hole as claimed in claim 27, wherein said first oxide film is formed by High Temperature Oxidation, and said second oxide film is formed by using plasma.

* * * * *